US009048570B2

(12) United States Patent
Goel

(10) Patent No.: US 9,048,570 B2
(45) Date of Patent: Jun. 2, 2015

(54) ZERO NO-LOAD USB POWER SUPPLY AND A METHOD FOR CONTROLLING THE POWER CONSUMPTION OF A USB POWER SUPPLY

(71) Applicant: Anil Goel, London (GB)

(72) Inventor: Anil Goel, London (GB)

(*) Notice: Subject to any disclaimer, the term of this patent is extended or adjusted under 35 U.S.C. 154(b) by 144 days.

(21) Appl. No.: 13/853,901

(22) Filed: Mar. 29, 2013

(65) Prior Publication Data

US 2013/0295782 A1 Nov. 7, 2013
US 2015/0079812 A9 Mar. 19, 2015

Related U.S. Application Data

(63) Continuation of application No. PCT/EP2011/066379, filed on Sep. 21, 2011.

(30) Foreign Application Priority Data

Oct. 1, 2010 (DK) .................................. 2010 70422

(51) Int. Cl.
*H01R 13/62* (2006.01)
*H01R 13/703* (2006.01)
*H02J 7/00* (2006.01)
*H05K 5/02* (2006.01)

(52) U.S. Cl.
CPC .......... *H01R 13/6205* (2013.01); *H01R 13/703* (2013.01); *H02J 7/0032* (2013.01); *H02J 2007/0062* (2013.01); *H05K 5/0278* (2013.01)

(58) Field of Classification Search
CPC .............................. H01R 13/6205; G06F 1/26
USPC ..................................................... 439/40, 159
See application file for complete search history.

(56) References Cited

U.S. PATENT DOCUMENTS 6,062,883 A     5/2000  Schreiber et al.
6,162,078 A *  12/2000  Chung ........................... 439/188
6,843,684 B2 *  1/2005  Milan ............................ 439/606
(Continued)

FOREIGN PATENT DOCUMENTS

CN          201142473       10/2008
CN          201178217        1/2009
(Continued)

OTHER PUBLICATIONS

"International Search Report of the International Searching Authority Dated Mar. 23, 2012; International Application No. PCT/EP2011/066379", (Mar. 23, 2012).

(Continued)

*Primary Examiner* — Michael Zarroli
(74) *Attorney, Agent, or Firm* — Blakely Sokoloff Taylor & Zafman LLP

(57) ABSTRACT

A USB socket having a receptacle that comprises first electrical connectors for receiving a USB plug having second electrical connectors that are configured for mating with the first electrical connectors further comprises at least an ejector. The ejector is electrically connected to a control unit for receiving a control signal. The ejector further having a pusher for pushing an inserted USB plug in the direction out of the receptacle to a position where the first electrical connectors are disconnected from the second electrical connectors. The pusher may be configured for activation of a push action as a consequence of receiving the control signal from the control unit.

17 Claims, 5 Drawing Sheets

(56) References Cited

U.S. PATENT DOCUMENTS

| | | | |
|---|---|---|---|
| 7,367,846 | B1 | 5/2008 | Yang |
| 7,419,393 | B2 * | 9/2008 | Milan ............................ 439/171 |
| 7,841,776 | B2 * | 11/2010 | DiFonzo et al. ................ 385/57 |
| 8,250,266 | B2 * | 8/2012 | Rugg et al. ....................... 710/72 |
| 8,770,857 | B2 * | 7/2014 | DiFonzo et al. ................ 385/57 |
| 2001/0006401 | A1 | 7/2001 | Nakagawa et al. |
| 2008/0007212 | A1 | 1/2008 | Theytaz et al. |
| 2008/0123277 | A1 | 5/2008 | Achsaf et al. |
| 2008/0185991 | A1 | 8/2008 | Harris et al. |
| 2010/0201208 | A1 | 8/2010 | Berghegger et al. |
| 2011/0285765 | A1 * | 11/2011 | Lamontagne et al. ............ 347/3 |

FOREIGN PATENT DOCUMENTS

| | | |
|---|---|---|
| CN | 100536249 | 9/2009 |
| CN | 201413914 | 2/2010 |
| CN | 201562841 | 8/2010 |
| WO | WO-2008/065659 | 6/2008 |

OTHER PUBLICATIONS

"Office Action Dated Apr. 26, 2011; Denmark Patent Application No. PA201070422", (Apr. 26, 2011).

"Search Report Dated Apr. 26, 2011; Denmark Patent Application No. PA201070422", (Apr. 26, 2011).

"Written Opinion of the International Searching Authority Dated Mar. 23, 2012; International Application No. PCT/EP2011/066379", (Mar. 23, 2012).

* cited by examiner

ZERO NO-LOAD USB POWER SUPPLY AND A METHOD FOR CONTROLLING THE POWER CONSUMPTION OF A USB POWER SUPPLY

CROSS-REFERENCE TO RELATED APPLICATION

This application is a continuation of International Application No. PCT/EP2011/066379 filed Sep. 21, 2011 which claims priority from Denmark patent application PA 2010 70422, filed on Oct. 1, 2010, all of which are included herein by reference for all that they contain.

BACKGROUND OF THE INVENTION

1. Field of the Invention

The present invention relates to a USB power supply, especially for charging mobile telephones, which has an automated reduction of power consumption in no-load condition. The invention also relates to a method for controlling the power consumption of a USB power supply.

2. Prior Art

Increasing awareness of electrical energy waste has raised objections against power supplies drawing electrical current even when not in use while plugged into electrical wall socket. The unintended no-load electricity consumption has received names such as phantom load or vampire load.

One of the groups of devices having increased attention are telephone chargers, which are typically left plugged into the electrical wall socket and which draw current even when not charging.

There has been industry wide initiative to reduce the energy wastage by mobile phone chargers due to no-load consumption. GSMA is leading the initiative with his Universal Charging Solution (USC). The GSMA recommends that the power supply, for example charger, must have a 4-star or higher no-load energy rating. In other words, the charger must achieve a no-load consumption <0.15 W.

Techniques for reducing no-load power consumption have been proposed in US patent application US2010/0201208 by Berghegger et al. In this case, the utility includes a controllable switch that is operative to decouple circuitry of the power device from a power source under certain no-load conditions. In one embodiment, the utility provides a switch control module that is operative to sense when an electronic device is coupled to the power device, and in response, to control the switch to couple the power device to the power source. The switch control module may also be operative to detect a condition when the electronic device is no longer drawing power from the power device, and in response, to control the electronically activated switch to decouple the power device from the power source.

Although the power device of US2010/0201208 reduces the power consumption in no-load condition, it does not provide a solution to stop the energy wastage completely, because it has no-load power consumption due to leak currents (page 3 left column first line).

An attempt for reducing the power consumption is found in Chinese patent document CN201142473 by WEI LIU discloses a USB power supply with a mechanical switch that breaks the AC circuit upon manual removal of the USB plug. How-ever, this requires awareness of the user to actually remove the USB plug from the socket, which is in contrast to the behavior of most users to only remove the electronic device from the other end of the cable and let the cable stay in the USB socket. Such behavior does not eliminate the vampire power consumption. Also, there is a substantial risk that the user lets the electronic device to be charged be connected to the USB cable and socket for longer than necessary, i.e. even after the electronic device is fully charged. Having typical behavior from users in mind, this attempt does not provide a proper solution.

Chinese utility model CN201562841U by INVENTEC CORP discloses a USB connector, for example in desktop computers or laptops, comprising an ejector with electromagnets that initiate ejection of the USB plug, for example from a USB data storage device, when the computer or laptop is turned off. The ejection prevents the user from forgetting to disconnect the data storage device in the computer. For further reminding the user not to forget disconnecting the USB connection to the USB plug, there may be provided a dialog box on the computer interface for indicating to the user that the USB should be pulled out when finished. Also in this case, the ejection of the USB cable requires action from the user, namely a response to the dialog box in the user interface or a powering off of the terminal. Power saving is not the issue of this disclosure.

Other disclosures are found in US2008/0007212 (THEYTAZ), CN 100536249 (HUAQI INFORM DIGIT SCIENCE), CN201413914Y (UNIV WENZHOU), WO2008/065659 (WALLETEX MICROELECTRONICS), US6062883 (SCHREIBER), US2008/0185991 (HARRIS).

FIGS. 1A and 1B illustrate two types of prior art sockets with USB power source as described in this introduction.

It would be desirable to have a device that eliminates vampire loads in USB chargers without requiring intervention by the user when the charging of a battery comes to an end.

Another disadvantage in connection with typical telephone chargers is the fact that they take up a wall socket for the connector of the charger, since they are often left in the wall socket even when not in use for charging. For this reason, different solutions have been proposed, namely USB in-wall sockets, for example as published in Chinese utility model CN201178217Y and reproduced in FIG. 1*a* or even as part of the multiple sockets in extension leads, as illustrated in FIG. 1*b* for a German type socket.

BRIEF DESCRIPTION OF THE DRAWINGS

The invention will be explained in more detail with reference to the drawing, where FIG. 1A Illustrates sockets with USB power source being a wall main power socket (PRIOR ART).

DETAILED DESCRIPTION OF THE PREFERRED EMBODIMENTS

Figure 1A:
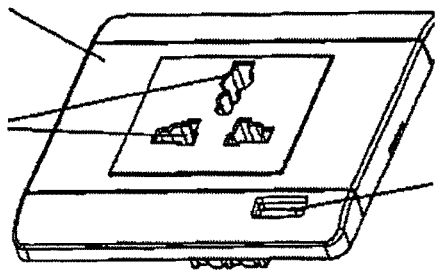
FIG. 1B illustrates sockets with USB power source being a wall socket reproduced from Chinese utility model CN2011788217Y (PRIOR ART).

It is the objective of the invention to provide an automated solution for zero no-load power consumption by USB power supplies for mobile devices, such as mobile phones, music players, for example MP3 players, iPod, headsets, for example Bluetooth headsets, digital cameras, portable gaming devices or pad computers, for example iPad. This objective is achieved with the following USB power supply device.

The device has a USB socket with a receptacle having first electrical connectors for receiving a USB plug with second electrical connectors that are mating with the first electrical connectors when inserted. The device also has a converter for converting alternating current, AC, to a USB Direct Current, DC. The converter has a DC output line electrically connected to the first electrical connectors in the receptacle for providing the DC to the first electrical connectors. The converter also has an AC input line for connection to an AC power source, typically the main power net.

The device has a control unit electrically connected to the first electrical connectors of the receptacle and contains a current measurement unit in order to be configured for measuring current drawn from the first electrical connectors. It creates a control signal if no power/current is drawn from the first electrical connectors or if changes in the current drawn from the first electrical connectors occur according to predetermined criteria, for example a drop of the current below a certain threshold, for example a gradual drop, and/or a drop of the current according to some predetermined gradient criteria. For example, the USB plug is ejected, if the mobile device is disconnected from the cable, in which case, the current abruptly changes to zero. Alternatively, the USB plug is ejected, when the current gradually drops and reaches a non-zero threshold, as this indicates a fully charged or almost fully charged device. For example, the device is configured for evaluating whether changes in the current drawn from the first electrical connectors indicate that the rechargeable battery of a connected charging device (terminal) is fully charged. The control signal is used according to the explanation below for entirely stopping the power consumption. For example, the mobile device is a mobile telephone, a music player, a headset, a digital camera, a portable gaming device, or a portable computer, as already mentioned above.

The device has a mechanically activatable switch functionally connected to the AC input line of the converter. The switch is operative to cause, and actually causes, connection of the AC input line to an AC power source only by the action of a USB plug being inserted into the receptacle to a position where the first connectors are mating, for example fully mating, with the second electrical connectors.

For example, the mechanically activatable switch comprises a slider sliding from a forward position, which is an off-position, to a backward position, which is an on-position, where the sliding action is caused by full insertion of a USB plug into the socket. The USB plug pushes the slider into the receptacle, for example by pressing engagement between the USB plug with the slider, such as between the front end of the USB plug and the slider. The slider is functionally connected to the AC input line for connection to the AC power source due to sliding to the backward position.

In addition, the switch is operable to disconnect, and actually disconnects, the AC input line from the AC power source by the USB plug being removed from the position where the first electrical connectors mate with the second electrical connectors.

For example, the switch has a slider that is sliding in the direction out of the receptacle by the action of moving the USB plug in the direction out of the receptacle. The slider is functionally connected to the AC input line for breaking the connection to the AC power source.

Furthermore, the device comprises an ejector electrically connected to the control unit. The ejector ejects the USB plug with cable at least partly out of the receptacle, when the control unit sends a control signal, which is received by the ejector.

In the case that the user forgets to remove the USB plug and only removes the electronic device, for example telephone, from the opposite end of the USB cable or once the device is fully charged, the automatic ejection also causes disconnection by the mechanical switch of the converter's AC power for a state of zero no-load consumption.

A re-establishment of the AC current to the converter is then caused be fully reinserting the USB plug into the receptacle.

With such a device, the user does not have to press any switches for changing the state with the zero consumption of electricity to a charging mode for a telephone or vice versa. The only simple and intuitively correct action that is required is the insertion of the USB plug fully into the socket. In addition, no advanced electronics are needed for stopping the power consumption after use; as soon as the cable is moved out or ejected out of the receptacle, the electrical power consumption is zero.

In a practical embodiment, the automatic ejector has a pusher for pushing an inserted USB plug in the direction out of the receptacle to a position where the first electrical connectors are disconnected from the second electrical connectors. This pushing may be of a character that the plug is pushed partly or entirely out of the socket.

The pusher of the ejector and the slider of the switch may be the same mechanical entity such that the function of the slider of the switch and the pushing action of the ejector are combined. The slider and/or ejector may be provided only on one, two or three of the sides of the receptacle or, alternatively, the combined slider and ejector may be provided with rectangular cross section precisely fitting inside the walls of the USB receptacle in order to engage with the male part of the USB plug during insertion and ejection.

In the preferred embodiment, the insertion of the USB plug into the USB socket moves the slider of the switch into the receptacle and causes closing the connection between the AC source and the input line of the converter. Upon activation of the ejector due to the control signal, the USB plug is ejected, and the mechanical movement of the slider/pusher causes the switch to break the AC connection again. Thus, the switch is only acting on the mechanical movement of the slider/pusher and needs no electrical control signal from the control unit. Only the ejector is receiving the control signal.

In summary, the sequence for controlling the power consumption of a USB power supply device is the following. With the requirements that the device comprises:

a USB socket with a receptacle having first electrical connectors for receiving a USB plug with second electrical connectors configured for mating with the first electrical connectors, a converter for converting alternating current, AC, to a USB Direct Current, DC, the converter having a DC output line electrically connected to the first electrical connectors and having an AC input line connected to an AC power source, a control unit electrically connected to the first electrical connectors for measuring current drawn from the first electrical connectors, a mechanically activatable switch functionally connected to the AC input line of the converter for connecting or disconnecting the AC input line, an ejector having a pusher for pushing an inserted USB plug in the direction out of the receptacle, the ejector being electrically connected to the control unit for receiving the control signal, the method comprises the following steps:

receiving a USB plug in the receptacle to a position where the first connectors are mating with the second electrical connectors;

during receiving of the USB plug in the receptacle acting of the USB plug on part of the mechanically switch and as a consequence causing the switch to connect the AC input line of the converter to an AC power source;

in the converter receiving AC from the AC power source, transforming the AC to USB DC, and providing the DC to the first electrical connectors;

by the control unit measuring current drawn from the first electrical connectors and creating a control signal if the current drawn from the first electrical connectors is below certain threshold or if changes in the current drawn from the first electrical connectors occur according to predetermined criteria;

receiving the control signal from the control unit at the ejector and, as a consequence, pushing the received USB plug by the pusher of the ejector in a direction out of the receptacle to a position where the first electrical connectors are disconnected from the second electrical connectors, by the mechanically activatable switch, as a consequence of the pushing of the USB plug, causing disconnecting the AC input line from the AC power source.

As already outlined above, the part of the mechanically switch is, optionally, identical to the slider.

In a practical embodiment, the device comprises spring mechanism connected to the pusher for moving the pusher. For example, the spring is loaded when a USB plug is inserted, and the device comprises a release mechanism for releasing the spring, when the pusher is to be activated. In an alternative embodiment, the device comprises a motor functionally connected to the pusher for moving the pusher. Such functional connection with mechanics known in the art, for example, it may be accomplished analogous to the motorized movement of a zoom objective in a camera. A further option is used of a solenoid in functional relationship with the pusher.

In a preferred embodiment, in order to safeguard that the USB plug is not entirely ejected and that the USB plug does not fall out of the socket, there may be provided means for holding the plug inside or at the socket at a position, where there is no mating between the first and second electrical connection. Thus, the USB plug is only partially ejected.

Such means for holding the USB plug in or at the socket, despite lack of connection between the first and second electrical connectors, may be of mechanical nature, for example a socket entrance with small tolerances in dimensions relative to the dimensions of the USB plug. As an alternative example, the socket entrance may have a rubber ring for holding the USB plug.

However, a different option is a magnetic field, which keeps the plug inside or at the socket while the electrical connection is broken. For example, the means for holding include a permanent magnet with a magnetic field configured in direction and strength for holding a USB plug in or at the socket. In cooperation with the permanent magnetic field, the USB plug comprising a material magnetically responsive to the magnetic field; iron has such properties, and it should be pointed out that by far most USB plugs contain magnetically responsive iron.

In a further embodiment, the pusher is made of a permanently magnetic material but USB receptacle is made of non-magnetic material, and when the pusher of the ejector pushes the USB plug in a direction out of the socket, the mechanical engagement between the pusher and the USB plug in combination with the magnetic interaction holds the USB plug in contact to the pusher even after partial or full ejection.

In case where the cable is partially ejected, not only it will be visually clear to the user that the USB plug is not plugged in the USB socket completely anymore but also a moderate motion or disturbance to the cable will make cable drop out of the socket for example an action such as disconnecting the fully charged phone from the other end of the cable. An extra visual indication may be provided by means of LED while charging the mobile device.

In a practical embodiment, the USB socket, the converter, the control unit, the switch and the ejector are provided in a single housing. One option for the housing is in the form of a wall socket. Such a wall socket may have one or more normal main power socket besides the USB socket. A second alternative is a socket module comprising, in addition to the USB receptacle, a male plug for connection with a standard main AC power wall socket and with a likewise female receptacle for receiving a similar plug. A further alternative is a device as part of an extension cord for AC power or travel adaptor.

Figure 2A:
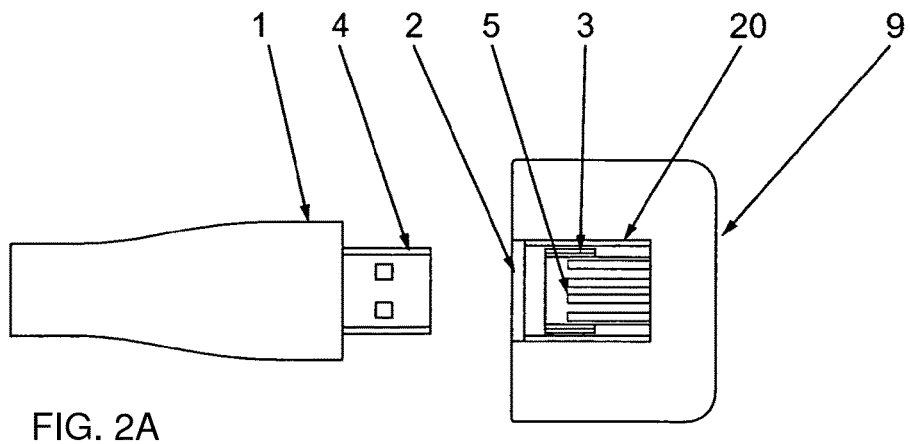
FIG. 2A illustrates a first system prior to insertion according to the invention.
Figure 2B:
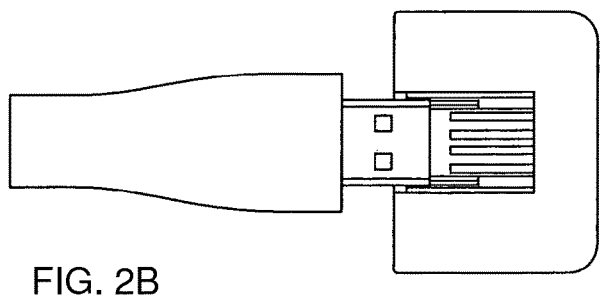
FIG. 2B illustrates the first system at insertion point or ejection point according to the invention.
Figure 2C:
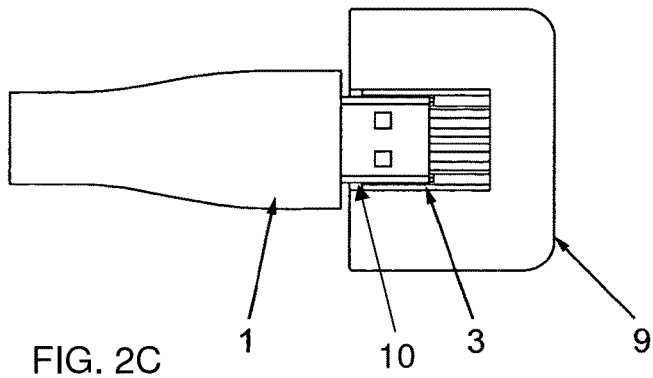
FIG. 2C illustrates the first system after full insertion or prior to ejection according to the invention.

FIG. 2A illustrates a combination of a USB plug 1 and a USB socket 2. The socket 2 has a mechanical switch, for example with a slider 3 as illustrated, which when pressed into the socket 2 by the plug 1 causes the switch to establish an electrical connection between the AC current main power supply and a converter (not shown) for converting the AC current from the main power supply to a DC current for the USB power source, which then is fed to the USB socket 2 and delivered to the USB plug 1 when this is inserted into the receptacle 20 of the socket 2, as illustrated in FIG. 2C. When the cable with the plug 1 is taken out of the socket 2, the mechanical switch with the slider 3 breaks the electrical connection between the AC current main power supply and the converter, such that no power is consumed as there is no leak current or other stand-by current. FIG. 2B illustrates the case, where the plug 1 is partially into the receptacle 20 of the socket 2 (starting point i.e. off position, the plug would fall on the ground if not held in position by the user) but has not yet activated the mechanical switch and there is no connection between the male electrical connectors 4 of the plug 1 and the female electrical connectors 5 of the socket 2.

For the case that the consumer leaves the USB cable, for example a telephone charger cable, with plug 1 inside the socket 2, even after charging of the telephone has finished, the mechanical switch would remain in the activation position/orientation if the cable had not be ejected. Therefore, the slider 3 is also used as a pusher for pushing the USB plug 1 in a direction away from the socket for ejection.

Whereas the sequence for the insertion is from FIG. 2A to FIG. 2C, the ejection is from FIG. 2C to FIG. 2B. At FIG. 2B the cable would fall itself out of the socket.

The ejection of the USB plug 1 is controlled by a controller (not shown) integrated in the housing 9. In the shown embodiment, the socket 2, the converter (not shown), the switch, the controller, and the ejector are in one single housing 9. In FIG. 2A, the slider/ejector 3 is driven by means (not shown) that surround the receptacle 20, for example a solenoid.

Figure 3A:
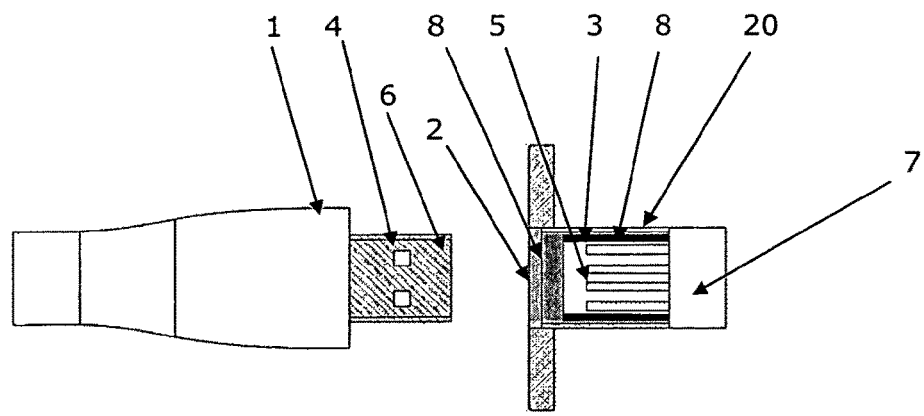
FIG. 3A illustrates an alternative system including a magnetic field prior to insertion according to the invention.
Figure 3B:
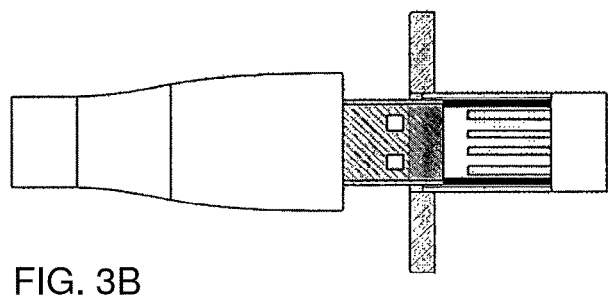
FIG. 3B illustrates the alternative system at insertion point or ejection point according to the invention.
Figure 3C:
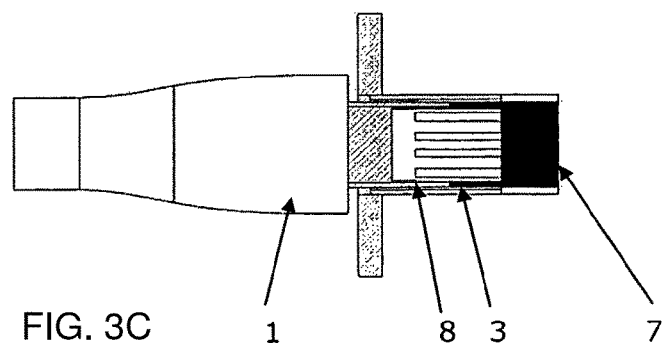
FIG. 3C illustrates the alternative system after full insertion or prior to ejection according to the invention.

A slightly different embodiment is illustrated in FIG. 3A, where the socket 2 contains a slider/pusher 3, for which an activator 7 is provided at the end of the receptacle 20. Once the plug 1 is pressed in into the socket 2, the slider/pusher 3 is pushed further into the socket 2, which is illustrated by the sequence of FIG. 3B to FIG. 3C. For ejection of the plug 1, the ejection activator 7 is activated by a control signal from the controller and causes the slider/pusher 3 to move a distance in a direction away from the socket 2, where the distance is sufficient to break the electrical connection between the male connector 4 and the female connector 5, which is resembled by FIG. 3B. The control signal is typically caused, when the controller measures a drop in current because of a fully charged battery of an electronic device, for example a mobile telephone or mobile music player. Also the current drop by a decoupling of the USB plug from the socket 2 when pulled out by the user causes the pusher to move forward for ejection of the USB plug and cable.

In order to safeguard that the USB plug 1 is not entirely ejected and falls out of the socket, there may be provided means for holding the plug 1 inside or at the socket 2 at a position, where there is no electrical connection between the male 4 and female 5 electrical connectors. Such means may be of mechanical nature, for example a rubber ring at the entrance of the receptacle holding the USB plug.

FIG. 3C illustrates, a different option of magnetic field 8, to held the plug inside or at the socket while the electrical connection is broken. For example, the slider/pusher 3 is made of a magnetic material providing a magnetic field 8 which holds the USB plug in contact with the slider/pusher 3 whereas receptacle 20 is made of non-magnetic material. The magnetic field is shown as a grey area in front of the slider/pusher 3. When the slider/pusher 3 has pushed the USB plug 1 so far out of the receptacle 20 that the electrical connection is broken, the front end 6 of the USB plug 1 may still be held in contact to the slider/pusher 3 by the magnetic force from the permanent magnetic field 8 of the slider/pusher 3. The use of a magnetic field may also be used in the embodiment of FIG. 2C.

Figure 4A:
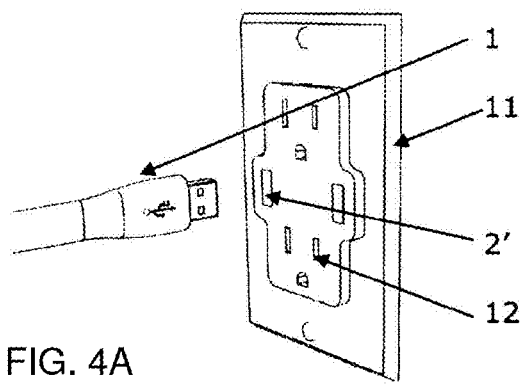
FIG. 4A illustrates a wall module with two AC main power sockets and two USB receptacles prior to insertion.
Figure 4B:
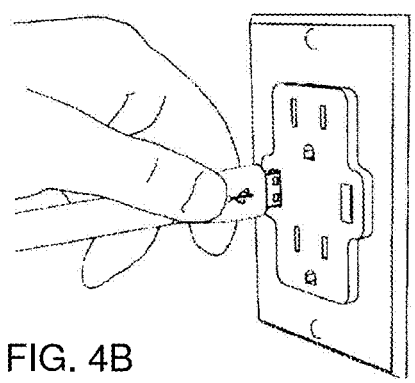
FIG. 4B illustrates a wall module with two AC main power sockets and two USB receptacles at insertion point or ejection point.
Figure 4C:
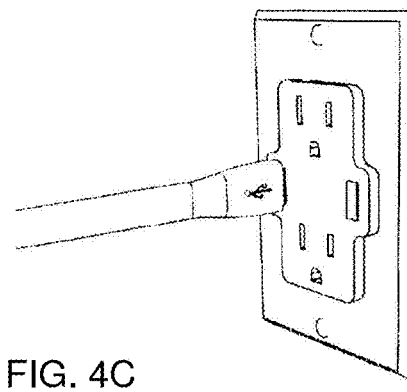
FIG. 4C illustrates a wall module with two AC main power sockets and two USB receptacles prior to ejection.

FIGS. 4A, 4B and 4C illustrate a wall socket module 11 with female standard receptacle 12 in addition to a USB socket 2' as a USB power source. The USB socket 2' is part of a device as described under FIGS. 2A, 2B and 2C and FIGS. 3A, 3B and 3C above with automatic zero-load mode as described above and, optionally, with partial ejection of the USB plug from the socket 2'.

Figure 5A:
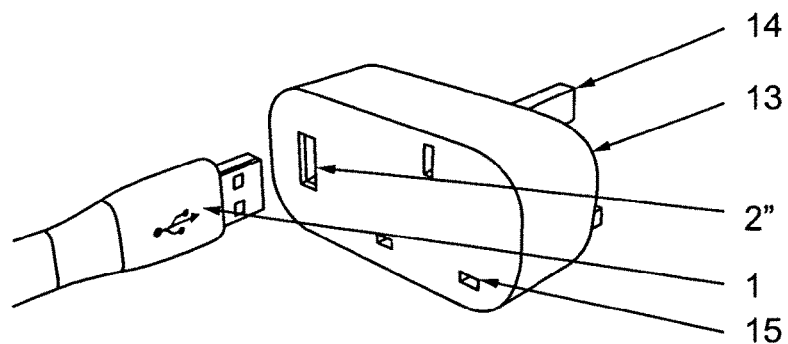
FIG. 5A illustrates a socket module with a male and female main power connectors and with a USB receptacle prior to insertion.
Figure 5B:
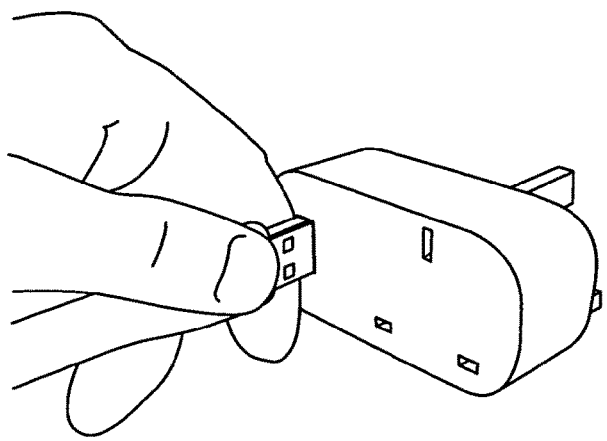
FIG. 5B illustrates a socket module with a male and female main power connectors and with a USB receptacle at insertion point.
Figure 5C:
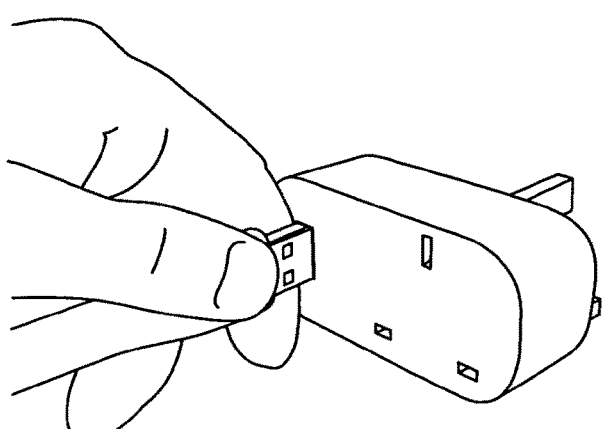
FIG. 5C illustrates a socket module with a male and female main power connectors and with a USB receptacle at ejection point

FIGS. 5A, 5B and 5C illustrate a socket module 13 with a male plug 14 for connection with a standard wall socket and with a likewise female receptacle 15 for receiving a similar plug. In addition, the socket module 13 comprises a USB socket 2" as a USB power source. The USB socket 2" is part of a device as described under FIGS. 2A, 2B and 2C and FIGS. 3A, 3B and 3C above with switch, and optionally automatic ejection of the USB plug from the connector.

Figure 1B:
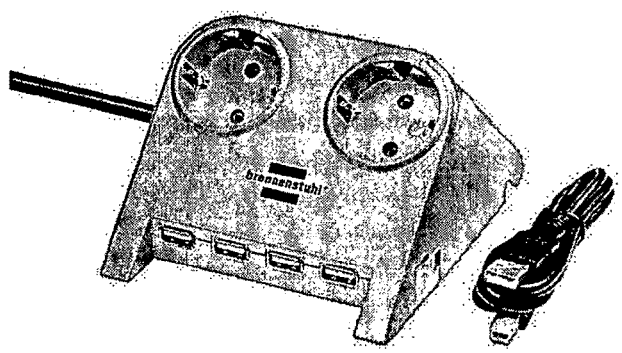

As an alternative to the socket module, the USB power source may be incorporated in an extension leads, for example as illustrated in FIG. 1B.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A USB power supply device comprising:
   a USB socket (2) with a receptacle (20) having first electrical connectors (5) for receiving a USB plug (1) with second electrical connectors (4) configured for mating with the first electrical connectors (5);
   a converter for converting alternating current, AC, to a USB Direct Current, DC, the converter having a DC output line electrically connected to the first electrical connectors (5) for providing the DC to the first electrical connectors (5) and having an AC input line for receiving AC,
   a control unit electrically connected to the first electrical connectors (5) and configured for measuring current drawn from the first electrical connectors (5) and configured for creating a control signal if no power is drawn from the first electrical connectors (5) or if changes in the current drawn from the first electrical connectors occur according to predetermined criteria; and
   a mechanically activatable switch (3) functionally connected to the AC input line of the converter and operative to cause connection of the AC input line of the converter to an AC power source as a consequence of the USB plug (1) being inserted into the receptacle (20) to a position where the first connectors (4) are mating with the second electrical connectors (5);
   characterized in that the device comprises:
   an ejector being electrically connected to the control unit for receiving the control signal, the ejector having a pusher (3) for pushing an inserted USB plug in the direction out of the receptacle (20) to a position where the first electrical connectors (5) are disconnected from the second electrical connectors (4), the pusher (3) being configured for activation of a push action as a consequence of receiving the control signal from the control unit.

2. A device according to claim 1, wherein the predetermined criteria is a gradual drop of the current below a predetermined non-zero threshold or a drop of the current according to predetermined gradient criteria.

3. A device according to claim 1, wherein the mechanically activatable switch comprises a slider (3) arranged inside the socket slidably from a forward position to a backward position, the slider (3) being configured for a sliding action caused by engagement between the slider and the USB plug (1) when inserted into the receptacle (20).

4. A device according to claim 3, wherein the slider (3) and the pusher (3) are a combined single entity.

5. A device according to claim 1, wherein the device has means (8,10) to hold the USB plug (1) in or at the USB socket (2) without mating between the first (4) and second (5) electrical connectors.

6. A device according to claim 5, wherein the means (10) include a permanent magnet with a magnetic field configured in direction and strength for holding a USB plug (1) in or at the socket (2), the USB plug comprising a material magnetically responsive to the magnetic field.

7. A device according to claim 6, wherein the means (10) comprises the pusher (3) being made of a permanently magnetic material for magnetically contacting and holding the USB plug (1).

8. A device according to claim 1, wherein the USB socket (2), the converter, the control unit, the switch (3), and the ejector (3) are provided in a single housing (9).

9. A device according to claim 8, wherein the housing is a wall socket (11).

10. A device according to claim 9, wherein the housing is a socket module (13) comprising, in addition to the USB receptacle (20), a male plug (14) for connection with a standard main AC power wall socket and with a likewise female receptacle (15) for receiving a similar plug.

11. A device according to claim 1, wherein the device comprises spring mechanism connected to the pusher for moving the pusher.

12. A device according to claim 1, wherein the device comprises a motor functionally connected to the pusher for moving the pusher.

13. A device according to claim 1 in combination with a mobile device, the mobile device comprising a rechargeable battery and being connected to the device by a USB cable for charging of the battery in the mobile device, wherein the mobile device is a mobile telephone, a music player, a headsets, a digital camera, a portable gaming device, or a portable computer.

14. A combination of claim 13, wherein the mobile device is a mobile telephone.

15. A method for controlling the power consumption of a USB power supply device, the device comprising:
  a USB socket (2) with a receptacle (20) having first electrical connectors (5) for receiving a USB plug (1) with second electrical connectors (4) configured for mating with the first electrical connectors (5);
  a converter for converting alternating current, AC, to a USB Direct Current, DC, the converter having a DC output line electrically connected to the first electrical connectors (5) and having an AC input line connected to an AC power source,
  a control unit electrically connected to the first electrical connectors (5); and
  an ejector having a pusher (3) for pushing an inserted USB plug in the direction out of the receptacle (20), the ejector being electrically connected to the control unit for receiving the control signal;
the method comprising:
receiving a USB plug (1) in the receptacle (20) to a position where the USB plug's (1) second electrical connectors (4) are mating with the receptacle's (2) second electrical connectors (4);
during receiving of the USB plug (1) in the receptacle (2) acting of the USB plug (1) on part of the mechanically activatable switch (3) and as a consequence causing the switch (3) to connect the AC input line of the converter to an AC power source;
by the converter receiving AC from the AC power source, transforming the AC to USB DC, and providing the DC to the first electrical connectors (5);
by the control unit measuring current drawn from the first electrical connectors (5) and creating a control signal if no power is drawn from the first electrical connectors (5) or if changes in the current drawn from the first electrical connectors occur according to predetermined criteria;
characterized in that the method comprises:
receiving the control signal from the control unit at the ejector and, as a consequence, pushing the received USB plug (1) by the pusher (3) of the ejector in a direction out of the receptacle (20) to a position where the USB plug's (1) second electrical connectors (4) are disconnected from the receptacle's (2) first electrical connectors (5),
by the mechanically activatable switch (3), as a consequence of the pushing of the USB plug, causing disconnecting the AC input line from the AC power source.

16. A method according to claim 15, wherein the predetermined criteria comprise a gradual drop of the current below a certain non-zero threshold or a drop of the current according to some predetermined gradient criteria or both.

17. A method according to claim 15, wherein the method comprises evaluating in the device whether changes in the current drawn from the first electrical connectors indicate a fully charged state.

* * * * *